United States Patent
Lee et al.

(10) Patent No.: US 6,636,998 B1
(45) Date of Patent: Oct. 21, 2003

(54) SEMICONDUCTOR MEMORY DEVICE AND PARALLEL BIT TEST METHOD THEREOF

(75) Inventors: Jae Woong Lee, Seoul (KR); Myeong O Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 378 days.

(21) Appl. No.: 09/610,498

(22) Filed: Jul. 5, 2000

(30) Foreign Application Priority Data

Oct. 20, 1999 (KR) .............................................. 99-45574

(51) Int. Cl.[7] .......................... G01R 31/28; G06F 11/00; G11C 29/00
(52) U.S. Cl. ........................ 714/735; 714/718; 714/719; 365/201; 365/189.07
(58) Field of Search ................................ 714/735, 718, 714/719, 720, 724; 365/200, 189.07, 201

(56) References Cited

U.S. PATENT DOCUMENTS 5,241,501 A * 8/1993 Tanaka ........................ 365/201
5,917,764 A * 6/1999 Ohsawa et al. .............. 365/200

* cited by examiner

Primary Examiner—Emmanuel L. Moise
(74) Attorney, Agent, or Firm—Mills & Onello, LLP

(57) ABSTRACT

A semiconductor memory device and a parallel bit test method thereof comprises a memory cell array having a plurality of memory cells, an address generator for accessing memory cells of the memory cell array in response to externally applied addresses; a test mode setting register for storing an externally applied test mode setting command; a test pattern data register for storing test pattern data applied from the test mode setting register and for outputting test pattern data at the time of performing a read command; and a comparator for comparing data read from the memory cells of the memory cell array with data of corresponding bits of test pattern data output from the test pattern data register and for generating test result data. Accordingly, the device is adapted for correctly detecting and distinguishing defective memory cells, and is amenable to performing bit tests using various non-uniform test pattern data.

10 Claims, 6 Drawing Sheets

SEMICONDUCTOR MEMORY DEVICE AND PARALLEL BIT TEST METHOD THEREOF

BACKGROUND OF THE INVENTION

1. Field of the Invention

The present invention relates to a semiconductor memory device. More particularly, the present invention relates to a semiconductor memory device and a parallel bit test method thereof capable of accurate detection of defective memory cells at the time of performing a parallel bit test.

2. Description of the Background Art

A conventional semiconductor memory device prepares for a parallel bit test in response to a test mode setting command at the time of performing the test. If a write command is applied from a tester, the semiconductor memory device writes test pattern data supplied by the tester to a memory cell array. If a read command is generated by the tester, the semiconductor memory device reads data from the memory cell array. Following this, the memory device compares two data elements read from the memory cell array and detects whether the comparison result indicates that the data are identical with each other, and outputs the result to the tester.

However, the conventional parallel bit test requires that two identical test pattern data bits be written to and read from each pair of memory cells during application of the test pattern data. In addition, the memory device requires that the pairs of read test pattern data elements are compared with each other, and the comparison result is output to the tester.

For example, in the case where the memory device writes identical data to two memory cells among four memory cells in the memory cell array, and compares two data output from the four memory cells in pairs of two by two; if the two data are identical with each other, the memory cells are determined to be normal. If the two data are different, the memory cells are determined to be defective. That is, the memory device produces one comparison result in comparing the four data bits. If the memory cells are determined to be defective by the comparison result, the four memory cells are replaced with redundant memory cells.

In this test configuration, in the case where each of two memory cells into which the identical data is written are defective and two data output from the memory cells are identical with each other, the memory cells are determined not to be defective, but instead determined to be normal. For example, if data stored as "11" are all read as "00" since both of two memory cells are defective, the memory cells are determined to be normal even though the memory cells are actually defective.

Accordingly, the parallel bit test method for conventional semiconductor memory device can not input various test patterns to the device for testing memory cells. In the event that all memory cells in which identical data are stored are defective, the resulting comparison data will incorrectly indicate that the cells are non-defective.

SUMMARY OF THE INVENTION

One object of the present invention is to provide a semiconductor memory device which can correctly detect the existence of defective memory cells as well as enable a test using various test patterns.

Another object of the present invention is to provide a parallel bit test method of a semiconductor memory device for achieving the above-mentioned object.

According to a first aspect, the present invention is directed to a semiconductor memory device. The device comprises a memory cell array having a plurality of memory cells for storing data upon an externally applied write command and for retrieving data upon an externally applied read command. An address generator stores data to, and retrieves data from, the memory cells of said memory cell array, in response to an externally applied address. A pattern data register stores externally-applied pattern data to be written to and retrieved from the memory cells as said data according to said externally applied address, and outputs pattern data during retrieval of said data from said memory cells. A comparator compares the retrieved data from the memory cells with the corresponding pattern data, and generates test result data as a result of the comparison.

The semiconductor memory device may further comprising a test mode setting register for receiving an externally applied test mode setting command and said externally applied data, and, in response, initiating a bit test. The comparator may comprise a plurality of exclusive OR gates, each for comparing elements of said retrieved data with corresponding elements of said pattern data to generate intermediate comparison data, and an OR gate for performing an OR operation on the intermediate comparison data to generate said test result data.

The pattern data register may output said pattern data as said data to be written to said memory cell array, or, optionally, the test pattern data to be written to the memory cell array may be externally applied.

In a second aspect, the present invention is directed to a method for testing a semiconductor memory device having a memory cell array including a plurality of memory cells for storing data upon an externally applied write command and for retrieving data upon an externally applied read command. The method comprises applying a test mode command to the memory device; storing data corresponding to predetermined pattern data in the memory cells of said memory cell array in response to an externally applied address;

retrieving data from the memory cells in response to the externally applied address; and comparing the retrieved data from the memory cells with the corresponding pattern data, and generating test result data as a result of the comparison.

The method of the present invention may further comprise the step of receiving the externally applied test mode command and, in response, initiating a bit test. The step of comparing may be performed at a comparator comprising: a plurality of exclusive OR gates, each for comparing elements of said retrieved data with corresponding elements of said pattern data to generate intermediate comparison data; and an OR gate for performing an OR operation on the intermediate comparison data to generate said test result data. The predetermined pattern data may be stored in a register, or optionally, may be externally applied in a write operation.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

In order to more clearly provide an understanding of the semiconductor memory device of the present invention and a bit test method thereof a conventional semiconductor memory device and a parallel bit test method thereof will first be explained with reference to the attached drawings, followed by a detailed description of the present invention.

Figure 1:
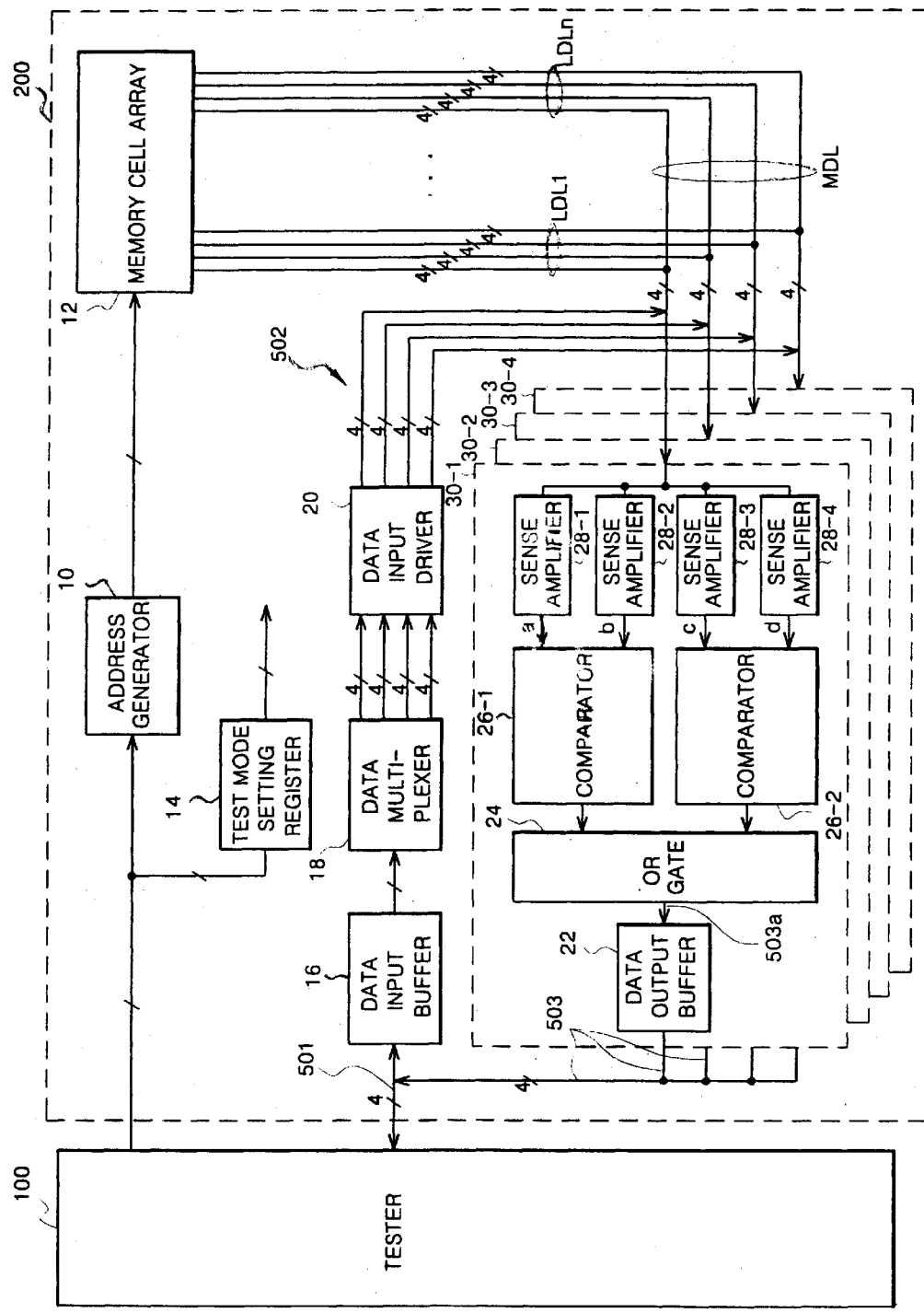
FIG. 1 is a block diagram exemplifying a parallel bit test system of a conventional semiconductor memory device.

FIG. 1 is a block diagram for explaining a parallel bit test method of a conventional semiconductor memory device testing apparatus, comprising a tester 100 and a semiconductor memory device 200. The memory device 200 includes an address generator 10, a memory cell array 12, a test mode setting register 14, a data input buffer 16, a data multiplexer 18, a data input driver 20 and data output circuits 30-1 to 30-4. Each of the data output circuits 30-1 to 30-4 comprises a data output buffer 22, an OR gate 24, comparators 26-1 and 26-2, and sense amplifiers 28-1 to 28-4.

In FIG. 1, 16 data bits, or elements 502, are internally generated by inputting 4 externally-generated data elements 501. The semiconductor memory device 200 reads and writes the 16 data elements at the same time.

The function of each block shown in FIG. 1 will now be explained.

The tester 100 is configured for testing the semiconductor memory device 200. A test is initiated by applying a test mode setting command. The address generator 10 accesses memory cells of the memory cell array 12 in response to an address input through address input pins(not shown) on the memory device. The memory cell array 12 writes data transferred from local data lines LDL1 . . . LDLn in response to an address input from the address generator 10 during a write operation, and transfers the written data to the local data lines LDL1 . . . LDLn during a read operation. The test mode setting register 14 stores a test mode setting command input from the address input pins(not shown), and in response, the semiconductor memory device 200 prepares for a test. The data input buffer 16 buffers and outputs 4-bits of data 501 input from data input pins(not shown). The data multiplexer 18 multiplexes the data output from the data input buffer 16, and outputs 16 bits of data in 4 groups of 4 bits. The data input driver 20 inputs the 16 bits of data output from the data multiplexer 18 and outputs the data to a main data line MDL.

Each of the data output circuits 30-1 to 30-4 generates the comparison result data 503 by comparing four data bits from the main data lines MDL in pairs of two by two. The sense amplifiers 28-1 to 28-4 amplify the data output from the main data line MDL and provide data bit pairs (a, b) and (c, d). The comparators 26-1 and 26-2 compare the respective data bits of each pair, for example, compares bits (a) and (b), and compares bits (b) and (c), in other words in groups of two by two (a, b) and (c, d), output from the sense amplifiers 28-1 to 28-4. The OR gate 24 generates comparison result data 503a by ORing the output data of the comparators 26-1 and 26-2. The data output buffer 22 buffers and outputs the comparison result data 503a to provide buffered output data 503 available through data input and output pins(not shown). In the present example, four comparison result data bits 503 output from the data output circuits 30-1 to 30-4 are provided through the data input and output pins(not shown).

Figure 2:
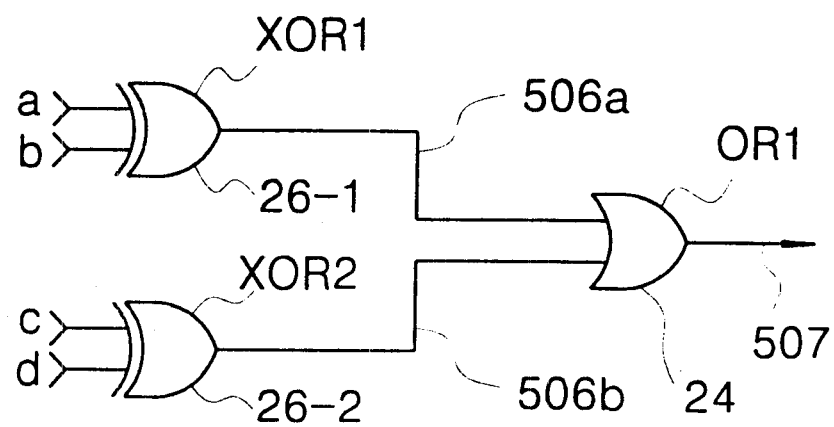
FIG. 2 is a logic circuit diagram illustrating an embodiment of the comparators and the OR gate of FIG. 1.

FIG. 2 is a logic circuit diagram illustrating an embodiment of the comparators 261, 26-2 and an OR gate 24 shown in FIG. 1, wherein the comparators 26-1, 26-2 comprise XOR gates XOR1 and XOR2, and the OR gate comprises OR gate OR1. The operation of the circuit illustrated in FIG. 2 will now be explained.

The XOR gate XOR1 compares data elements a and b output from the sense amplifiers 28-1 and 28-2, and generates a low data signal "0" in the case where the data a and b are identical, but generates a high data signal "1" in the case where the two data elements are not identical. Similarly, the XOR gate XOR2 compares data elements c and d output from the sense amplifiers 28-3 and 28-4, and generates a data signal "0" in the case where the data c and d are identical, but generates a data signal "1" in the case where the data c and d are not identical. The OR gate OR1 generates the result data signal "0" 507 when all of the output data 506a, 506b are "0", and generates the result data signal "1" 507 when at least one output data 506a, 506b is "1".

The tester 100 in turn determines corresponding memory cells to be normal in the case where the result data signal 507 is low "0", or to be defective in the case where the result data signal 507 is high "1".

Figure 3:
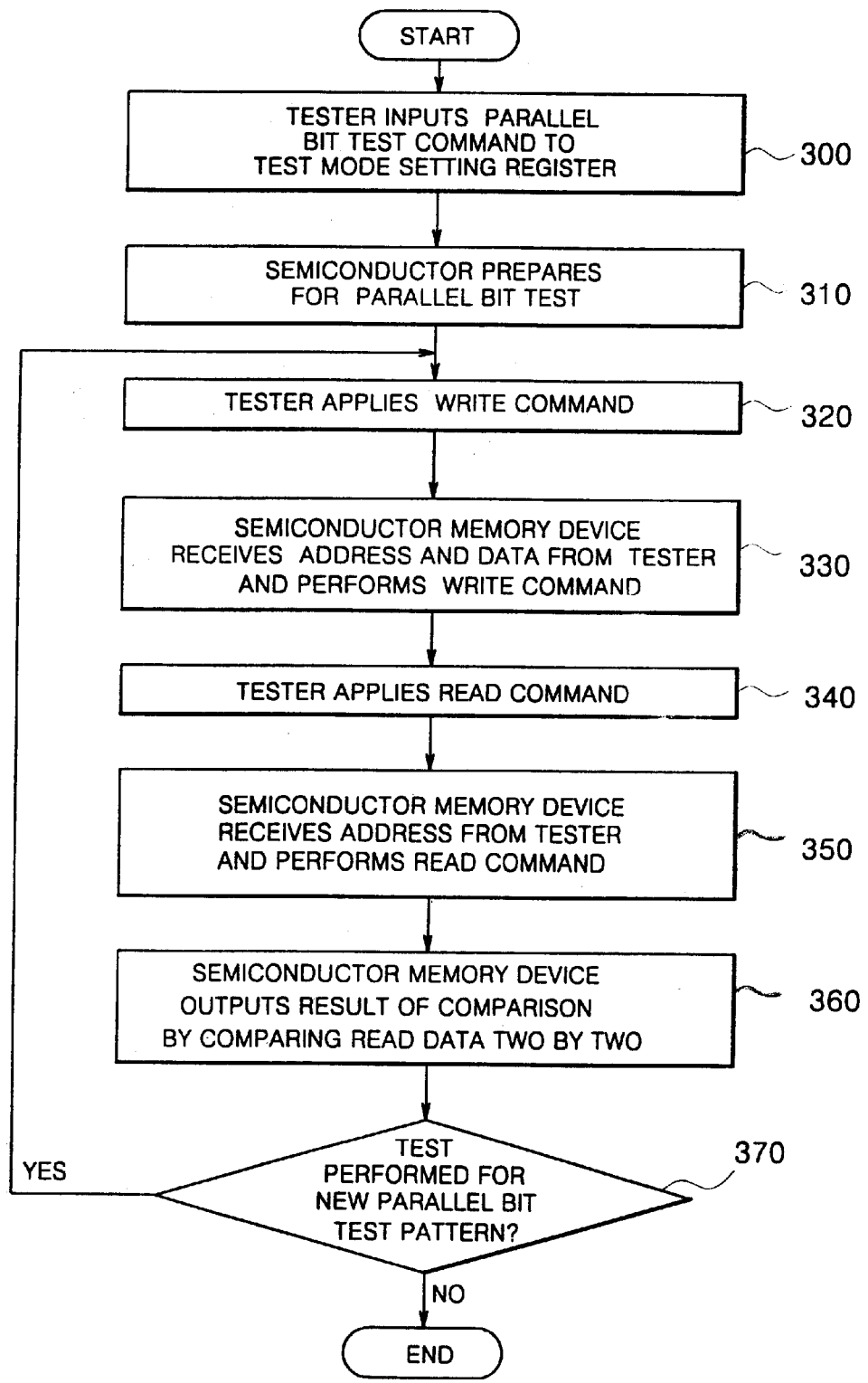
FIG. 3 is a flow diagram for explaining a parallel bit test method of the test system shown in FIG. 1.

FIG. 3 is a flow chart for explaining a parallel bit test method of the block diagram shown in FIG. 1. The operation of the device illustrated in FIG. 1 will now be explained with reference to FIG. 3.

The tester 100 first provides a parallel bit test command to the test mode setting register 14 of the semiconductor memory device 200 (step 300). In response, the semiconductor memory device 200 prepares for a parallel bit test (step 310). The tester 100 next applies a write command to the semiconductor memory device 200(step 320). The semiconductor memory device 200 in turn receives address and data information generated by the tester 100, generates an address by means of the address generator 10 and writes data by accessing corresponding memory cells of the memory cell array 12(step 330). The write data input from the tester 100 is transferred to the main data line MDL through the data input buffer 16, the data multiplexer 18 and the data input driver 20. Accordingly, the write data is written into memory cells of the memory cell array 12 corresponding to the address. By repeating the operation of step 330, data is written into all of memory cells of the memory cell array 12 in the semiconductor memory device 200.

The tester 100 next applies a read command to the semiconductor memory device 200(step 340). In response, the semiconductor memory device 200 receives an address generated from the tester 100, generates an address by means of the address generator 10 and reads data by accessing memory cells of the memory cell array 12(step 350) corresponding to the address. The read data is transferred to the sense amplifiers 28-1 to 28-4 of the data output circuits 30-1 to 30-4, respectively, through the main data line MDL. The sense amplifiers 28-1 to 28-4 amplify and output read data a, b, c and d. The comparators 26-1 and 26-2 compare the read data (a, b) and (c, d) in pairs of two by two, as described above, and output the result of comparison. The OR gate 24 generates comparison result data 503a by ORing the result of comparison. That is, each of the data output circuits 30-1 to 30-4 outputs the comparison result data 503 to the tester 100. By performing step 350 and step 360 repeatedly, a read operation is performed in all memory cells of the memory cell array 12 and the comparison result data 503 of the test is provided to the tester 100. The tester 100 next decides whether to perform a test with a different parallel bit test pattern (step 370). If a test using a new parallel bit test pattern is to be performed, step 320 is repeated. If not, the test operation comes to an end.

Note that in the above-described parallel bit test method of the conventional semiconductor memory device, it is required that the test pattern of the input data elements of a given pair (for example (a, b), (c, d)) are identical to each other; otherwise, the test will not perform properly. Accordingly, a parallel bit test operation operable with various test patterns of non-identical data can not be performed. That is, the semiconductor memory device of the conventional embodiment is compatible with data of only four different test patterns 1111, 0000, 1100 and 0011 among the possible 16 test pattern data. Furthermore, since the semiconductor memory device shown in FIG. 1 inputs two identical data and compares the identical read data two by two, the semiconductor memory device is prone to determining a pair of defective memory cells to be normal in the case where both of the cells provide the same erroneous test result.

Accordingly, the parallel bit test method of the conventional semiconductor memory device can not perform a parallel bit test operation for various test patterns. Also, the method can not correctly detect and distinguish defective memory cells.

Figure 4:
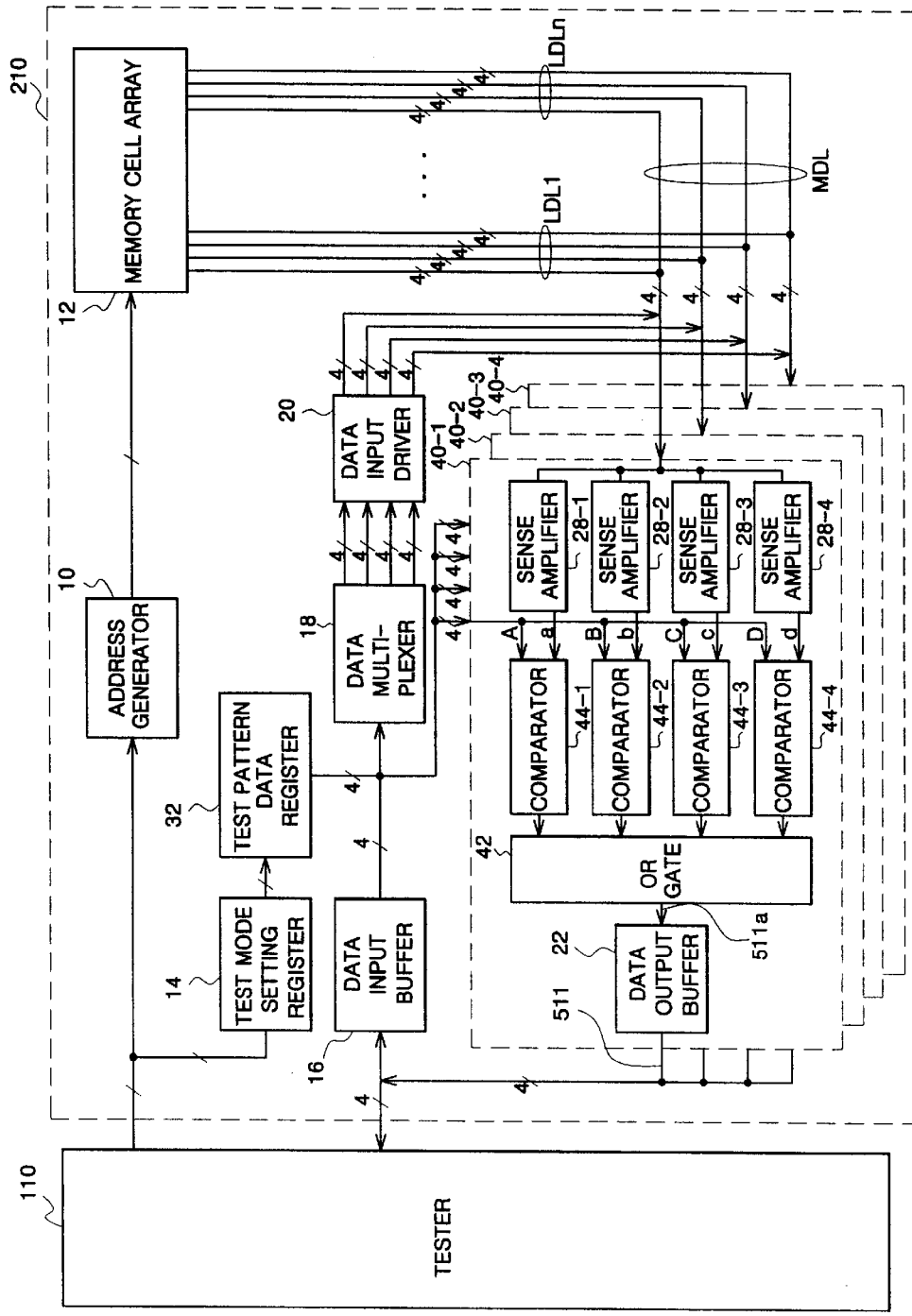
FIG. 4 is a block diagram illustrating an embodiment of a parallel bit test system according to the present invention.

FIG. 4 is a block diagram illustrating an embodiment of an apparatus for performing a parallel bit test method according to the present invention. In FIG. 4, blocks having the same function as those illustrated in FIG. 1 are denoted with identical numerals, and different blocks are denoted with different numerals.

The apparatus comprises a tester 110 and a semiconductor memory device 210 including an address generator 10, a memory cell array 12, a test mode setting register 14, a test pattern data register 32, a data input buffer 16, a data multiplexer 18, a data input driver 20, and data output circuits 40-1, 40-2, 40-3 and 40-4. Each of the data output circuits 40-1 to 40-4 includes sense amplifiers 28-1, 28-2, 28-3 and 28-4, comparators 44-1, 44-2, 44-3 and 44-4, an OR gate 42 and a data output buffer 22.

The present invention distinguishes over the conventional configuration shown in FIG. 1, at least in that it includes a test pattern data register 32 in an output stage of the test mode setting register 14. Other distinctions will be explained in further detail below, with the following detailed description of FIG. 4.

The tester 110 is configured for testing the semiconductor memory device 210. The semiconductor memory device 210 performs a memory test in response to a test mode setting command applied from the tester 110. The address generator 10 accesses memory cells of the memory cell array 12 by responding to an address input via address input pins(not shown). The memory cell array 12 writes data transferred from local data lines LDL1 . . . LDLn in response to an address input from the address generator 10 during a write operation, and transfers data stored in memory to the local data lines LDL1 . . . LDLn during a read operation. The test mode setting register 14 stores a test mode setting command and test pattern data input from address input pins(not shown), and, in response to an input test mode setting command, the semiconductor memory device 210 prepares for a test. In FIG. 4, the tester 110 preferably does not input test pattern data through data input and output pins(not shown), but rather, inputs the data to the test mode setting register 14 through the address input pins(not shown). That is, the data input buffer 16 is preferably not used at the time of performing a test. The data multiplexer 18 multiplexes the data output from the test pattern data register 32, and outputs 16-bit data in 4 groups of 4 bits. The data input driver inputs the 16 data bits output from the data multiplexer 18 and outputs them to a main data line MDL. Each of the data output circuits 40-1 to 40-4 compares the data on the main data line MDL and generates comparison result data 511. The sense amplifiers 28-1 to 28-4 each amplify and output 4 data bits of the main data line MDL. The comparators 44-1 to 44-4 compare data elements a, b, c and d output from the sense amplifiers 28-1 to 28-4 with data elements A, B, C and D provided by the test pattern data register 32. The OR gate 42 generates the comparison result data 511a by ORing the output data of the comparators 44-1 to 44-4. The data output buffer 22 buffers the comparison result data 511 a and outputs buffered result data 511 to the tester 110 through the data input and output pins(not shown). That is, four comparison result data bits 511 output from the data output circuits 40-1 to 40-4 are output to the tester 110 through the data input and output pins (not shown).

Figure 5:
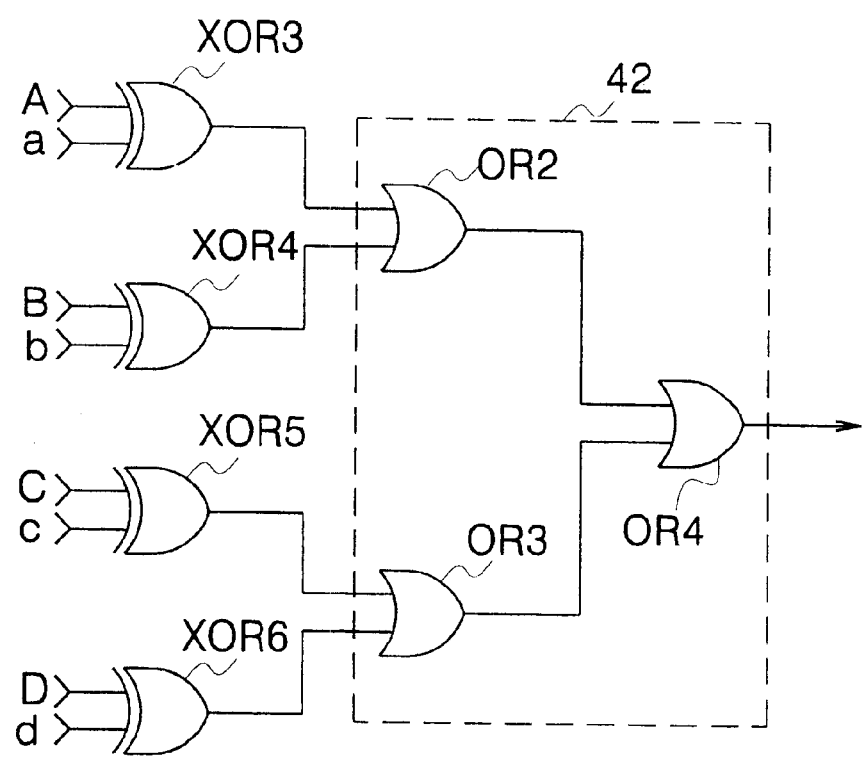
FIG. 5 is a logic circuit diagram illustrating an embodiment of the comparators and the OR gate of FIG. 4.

FIG. 5 is a logic circuit diagram illustrating an embodiment of the comparators and OR gate shown in FIG. 4, comprising XOR gates XOR3, XOR4, XOR5 and XOR6 and OR gates OR2, OR3 and OR4. In FIG. 5, the XOR gates XOR3, XOR4 and XOR5 and XOR6 correspond to the comparators 44-1 to 44-4 illustrated in FIG. 4, and the OR gates OR2, OR3, and OR4 correspond to the OR gate 42 of FIG. 4. The operation of the circuit illustrated in FIG. 4 will now be explained in detail.

The XOR gates XOR3 to XOR6 compare the memory output data a, b, c and d of the sense amplifiers 28-1 to 28-4 with the test pattern output data A, B, C and D of the test pattern data register 32, respectively, and generate a data "0" in the case where the output data are identical with each other, but generate a data "1" in the case where the output data are not identical. The OR gates OR2 to OR4 generate comparison result data at a low level "0" in the case where all the data output from the XOR gates are low "0", but generate comparison result data at a high level "1" in the case where at least one output data is high "1". The tester 110 in turn determines corresponding memory cells to be functioning normally when, for example, result data of "0" is provided, and to be defective in the case where result data of "1" is provided.

Figure 6:
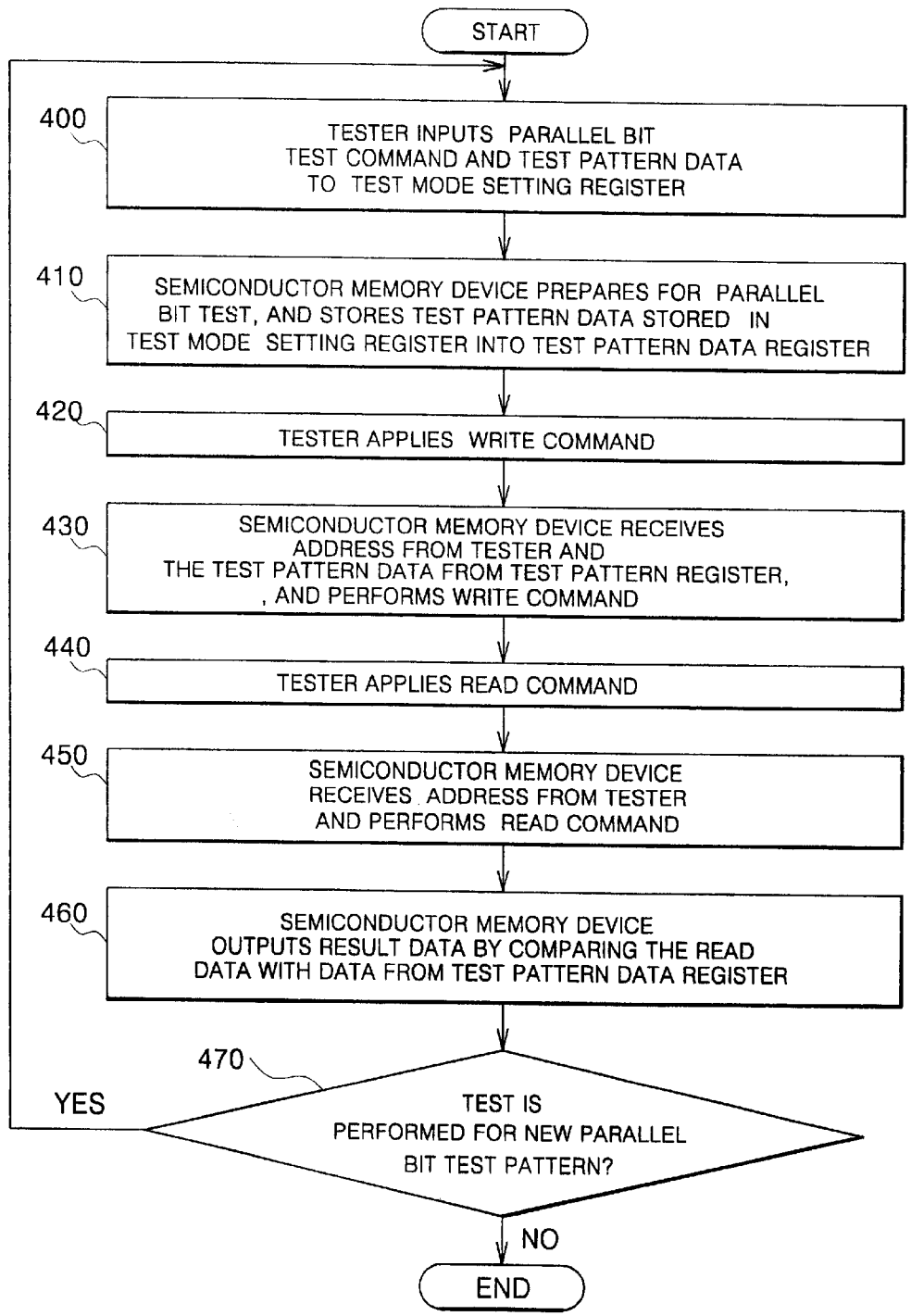
FIG. 6 is a flow diagram for explaining the parallel bit test method of the test system shown in FIG. 4.

FIG. 6 is a flow chart for explaining the parallel bit test method of the block diagram shown in FIG. 4. The tester 110 first inputs a parallel bit test command and test pattern data to the test mode setting register 14 of the semiconductor memory device 210(step 400). The semiconductor memory device prepares for a parallel bit test and stores the test pattern data stored in the test mode setting register 14 into the test pattern data register 32(step 410). Next, the tester 110 applies a write command to the semiconductor memory device 210(step 420). Then, the semiconductor memory device 210 receives data generated from the test pattern data register 32 and an address generated from the tester 110, generates an address by means of the address generator 10, and writes the test pattern data to memory by accessing the corresponding memory cells of the memory cell array 12(step 430). The test pattern data to be written is transferred to the main data line MDL through the test pattern data register 32, data multiplexer 18 and data input driver 20. By performing step 430 repeatedly, test pattern data is written into all memory cells of the memory cell array 12 in the semiconductor memory device 210.

Next, the tester 110 applies a read command to the semiconductor memory device 210(step 440). The address generator 10 receives address from tester and generates an internal address. And, the memory cell array 12 reads corresponding data in response to the internal address(step 450). The read data is transferred to the sense amplifiers 28-1 to 28-4 through data lines. The sense amplifiers 28-1 to 28-4 amplify and output the read data. The comparators 44-1 to 44-4 compare the memory output data a, b, c and d of the sense amplifiers 28-1 to 28-4 with the test pattern output data A, B, C and D directly provided by the test pattern data register 32, respectively, and output the comparison result data. The OR gate 42 performs an OR operation on the comparison result data and provides a test result signal 511 to the tester 110. By performing step 450 and step 460 repeatedly, data stored in all memory cells of the memory cell array 12 in the semiconductor memory device 210 are read and the test result data is provided to the tester 110. The tester 110 in turn determines whether to perform a test for a different parallel bit test pattern(step 470). If a test for a different pattern is to be performed, then step 400 is repeated; if not, the operation comes to an end.

Accordingly, the semiconductor memory device of the present invention can input all possibilities of test pattern data to the test pattern data register, and accurately test the memory cells, without the requirement, as in conventional embodiments, of writing identical data in pairs of two by two, as described above. Further, the semiconductor memory device of the present invention is capable of correctly detecting and distinguishing defective memory cells, since it generates the comparison result data by comparing the data read from memory with the original test pattern data stored in the test pattern data register.

In the above-described embodiment, the data stored in the test pattern data register 32 is written to the main data line MDL through the data multiplexer 18 and data input driver 20. However, in other embodiments, the write data can optionally be applied from the tester 110 to the main data line MDL through the data input buffer 16, data multiplexer 18 and data input driver 20 in the semiconductor memory device 210. Furthermore, although the data elements a, b, c, d, and A, B, C, D are described as being individual bits, each may represent groups of data bits.

Accordingly, the semiconductor memory device according to the present invention is compatible with a variety of test pattern data of various non-uniform forms, and is capable of correctly distinguishing defective cells from non-defective cells.

While this invention has been particularly shown and described with reference to preferred embodiments thereof, it will be understood by those skilled in the art that various changes in form and detail may be made herein without departing from the spirit and scope of the invention as defined by the appended claims.

What is claimed is:

1. A semiconductor memory device comprising
   a memory cell array having a plurality of memory cells for storing data upon an externally applied write command and for retrieving data upon an externally applied read command;
   an address generator for storing data to, and retrieving data from, the memory cells of said memory cell array, in response to an externally applied address;
   a pattern data register for storing externally-applied pattern data to be written to and retrieved from the memory cells as said data according to said externally applied address, and for outputting pattern data during retrieval of said data from said memory cells; and
   a comparator for comparing the retrieved data from the memory cells with the corresponding pattern data, and for generating test result data as a result of the comparison.

2. The semiconductor memory device of claim 1 further comprising a test mode setting register for receiving an externally applied test mode setting command and said externally applied data, and, in response, initiating a bit test.

3. The semiconductor memory device of claim 1, wherein said comparator comprises:
   a plurality of exclusive OR gates, each for comparing elements of said retrieved data with corresponding elements of said pattern data to generate intermediate comparison data; and
   OR gates for generating the result data of said test by ORing output signals of said plurality of exclusive OR gates.

4. The semiconductor memory device of claim 1, wherein said pattern data register outputs said pattern data as said data to be written to said memory cell array.

5. The semiconductor memory device of claim 1, said test pattern data to be written to the memory cell array is externally applied.

6. A method for testing a semiconductor memory device having a memory cell array including a plurality of memory cells for storing data upon an externally applied write command and for retrieving data upon an externally applied read command, comprising:
   applying a test mode command to the memory device;
   storing data corresponding to predetermined pattern data in the memory cells of said memory cell array in response to an externally applied address;
   retrieving data from the memory cells in response to the externally applied address;
   comparing the retrieved data from the memory cells with the corresponding pattern data, and generating test result data as a result of the comparison.

7. The method of claim 6 further comprising receiving the externally applied test mode command and, in response, initiating a bit test.

8. The method of claim 6, wherein said step of comparing is performed at a comparator comprising:
   a plurality of exclusive OR gates, each for comparing elements of said retrieved data with corresponding elements of said pattern data to generate intermediate comparison data; and
   OR gates for generating the result data of said test by ORing output signals of said plurality of exclusive OR gates.

9. The method of claim 6, wherein said predetermined pattern data is stored in a register.

10. The method of claim 6, wherein said predetermined pattern data to be written to the memory cell array is externally applied.

* * * * *